United States Patent [19]

Cognault et al.

[11] Patent Number: 5,046,037
[45] Date of Patent: Sep. 3, 1991

[54] MULTIPLIER-ADDER IN THE GALOIS FIELDS, AND ITS USE IN A DIGITAL SIGNAL PROCESSING PROCESSOR

[75] Inventors: Marc Cognault, Clichy; José Sanches, Montmagny; Dominique Brechard, Paris, all of France

[73] Assignee: Thomson-CSF, Puteaux, France

[21] Appl. No.: 439,042
[22] PCT Filed: Mar. 10, 1989
[86] PCT No.: PCT/FR89/00101
§ 371 Date: Nov. 3, 1989
§ 102(e) Date: Nov. 3, 1989
[87] PCT Pub. No.: WO89/08882
PCT Pub. Date: Sep. 21, 1989

[30] Foreign Application Priority Data

Mar. 17, 1988 [FR] France ............... 88 03431

[51] Int. Cl.⁵ ............... G06F 7/00
[52] U.S. Cl. ............... 364/746.1
[58] Field of Search ............... 364/746.1, 736, 754, 364/757

[56] References Cited

U.S. PATENT DOCUMENTS 3,805,037  4/1974  Ellison ............... 364/746.1
4,866,654  9/1989  Yamada ............... 364/754
4,918,638  4/1990  Matsumoto et al. ............... 364/746.1

OTHER PUBLICATIONS

IEEE Transactions on Computers, vol. C-20, No. Dec. 12, 1971, IEEE(US), Laws, Jr. et al.: "A Cellular-Array Multiplier for GF($2^m$)", pp. 1573-1578.

IEEE Transactions on Computers, vol. C-33, No. 4, Apr. 1984, IEEE(US), Yeh et al.: "Systolic Multipliers for Finite Fields GF($2^m$)", pp. 357-360.

Primary Examiner—Gary V. Harkcom
Assistant Examiner—Tan V. Mai
Attorney, Agent, or Firm—Oblon, Spivak, McClelland, Maier & Neustadt

[57] ABSTRACT

The multiplier-adder in the Galois fields can have parameters applied to it, i.e. it is possible to choose the Galois field CG($2^m$) in which the polynomial operations are performed, with m at most equal to N, N being predetermined by the designer. The multiplier-adder is made up of a decoder (10) organized as N identical elementary cells receiving the generator polynomial G(m:0) and supplying the generator polynomial without its least significant bit G(m−1:0) and a polynomial marking the degree of the generator polynomial, DG(m−1:0), and a computing matrix (20) organized as N columns of identical elementary cells receiving the polynomials A, B and C of the Galois field CG($2^m$) and supplying a polynomial result $P=(A*B)_{modulo\ G}+C$. The multiplier-adder has usage for example as a digital signal processing processors for error detecting and correcting encoding and decoding using BCH or RS codes.

4 Claims, 5 Drawing Sheets

MULTIPLIER-ADDER IN THE GALOIS FIELDS, AND ITS USE IN A DIGITAL SIGNAL PROCESSING PROCESSOR

The invention relates to the field of digital telecommunications, and more particularly to the digital signal processing necessary in this type of application.

Digital telecommunications are subject to interference which necessitates an efficient protection of the information by encoding using error detecting and correcting codes.

Codes which are particularly advantageous for this type of error detection and correction are the Reed Solomon (RS) or BCH type codes which provide a reasonable balance between complexity of implementation and efficiency. These codes make use of processing of polynomials with values in the Galois fields.

The French Patent Application No. 86 14677 in the name of the Applicant describes a polynomial operator in the Galois fields and a digital signal processing processor using such an operator. The central component of such an operator is a multiplier-adder circuit performing the operations of multiplication and addition of polynomials in the Galois fields. The multiplier-adder described in this application was not optimized, either with regard to the number of logic levels necessary for the computation or to the area of the operator, this resulting in too great a duration of computation and too great a size.

Furthermore there is known, from an article by B. A. LAWS Jr et al. entitled "A cellular-array multiplier for GF(2 m)", pages 1575-1578, Vol. C20, No. 12, Dec. 1971 of the IEEE Transactions on computers, a multiplier-adder of the matrix type using a breakdown of the polynomial operation $P=A*B+C$ which performs an iterative computation by means of a square matrix structure.

The subject of the invention is a multiplier-adder which is simple and to which parameters can be applied, is programmable in the Galois fields and has a faster processing speed, this operator being able to process all of the Galois fields up to $CG(2^N)$, N being determined at the outset by the designer.

According to the invention, a multiplier-adder in one of the fields up to $CG(2^N)$ where N is a predetermined integer, having three multiple inputs intended to receive the coefficients of polynomial operands A, B and C of degree m−1 less than N for the polynomial operation P in the Galois field of degree m, $CG(2^m)$: $P=(A*B)+C$, where * and + are respectively multiplication and addition, performed Modulo G, in the Galois field $CG(2^m)$ of generator polynomial G, and a data input to which parameters can be applied, for this generator polynomial, comprising:

a decoder constituted from a line of N elementary identical cells $CD_j$, arranged in order from j=0 to N−1, receiving the coefficients of the generator polynomial G(N:0) and transmitting the coefficients of this polynomial without the one having the highest degree G(N−1:0) and a polynomial with a significant coefficient derived by the logical combination of the generator polynomial marking the degree m of the chosen Galois field, DG(N−1:0);

a computing matrix constituted from p lines of identical elementary computing cells for performing the polynomial computation in p steps, the cells of the last line supplying the terms of degrees 0 to m−1 of the resulting polynomial P, is characterized in that, for a computation in p=2N−1 steps, the computing matrix comprises 2n−1 lines from i=0 to 2(N−1) and N columns of j=0 to N−1 of cells $CM_{i,j}$ connected in a tree structure, the non-connected inputs receiving logic "0" levels, each elementary computing cell $MC_{i,j}$ comprising:

five vertical inputs connected to the vertical outputs of the preceding cell of the same column, receiving the terms of degree j, G(j) DG(j) and B(j) of the generator polynomial, of the degree polynomial, and of the polynomial B, the term of degree i−j of the polynomial A, and the term of degree j of an intermediate result $z^{i-1}$ (j), two lateral inputs receiving from the cell of the column of inferior rank of the same line the term of degree j−1 of the intermediate result $z^{i-1}$ (j−1) and the term of degree (i+1−j) A(i+1−j) of the polynomial A, two lateral outputs to be applied to the cell of superior rank of the same line supplying the term of degree j of the intermediate result $z^{i-1}$ (j) and the term of degree i−j, A(i−j) of the polynomial A.

Another subject of the present invention is the use of such a multiplier-adder, which is programmable in the Galois fields, in a digital signal processing processor.

The invention will be better understood and other characteristics will appear with the help of the following description given with reference to the appended figures in which.

Figure 6:
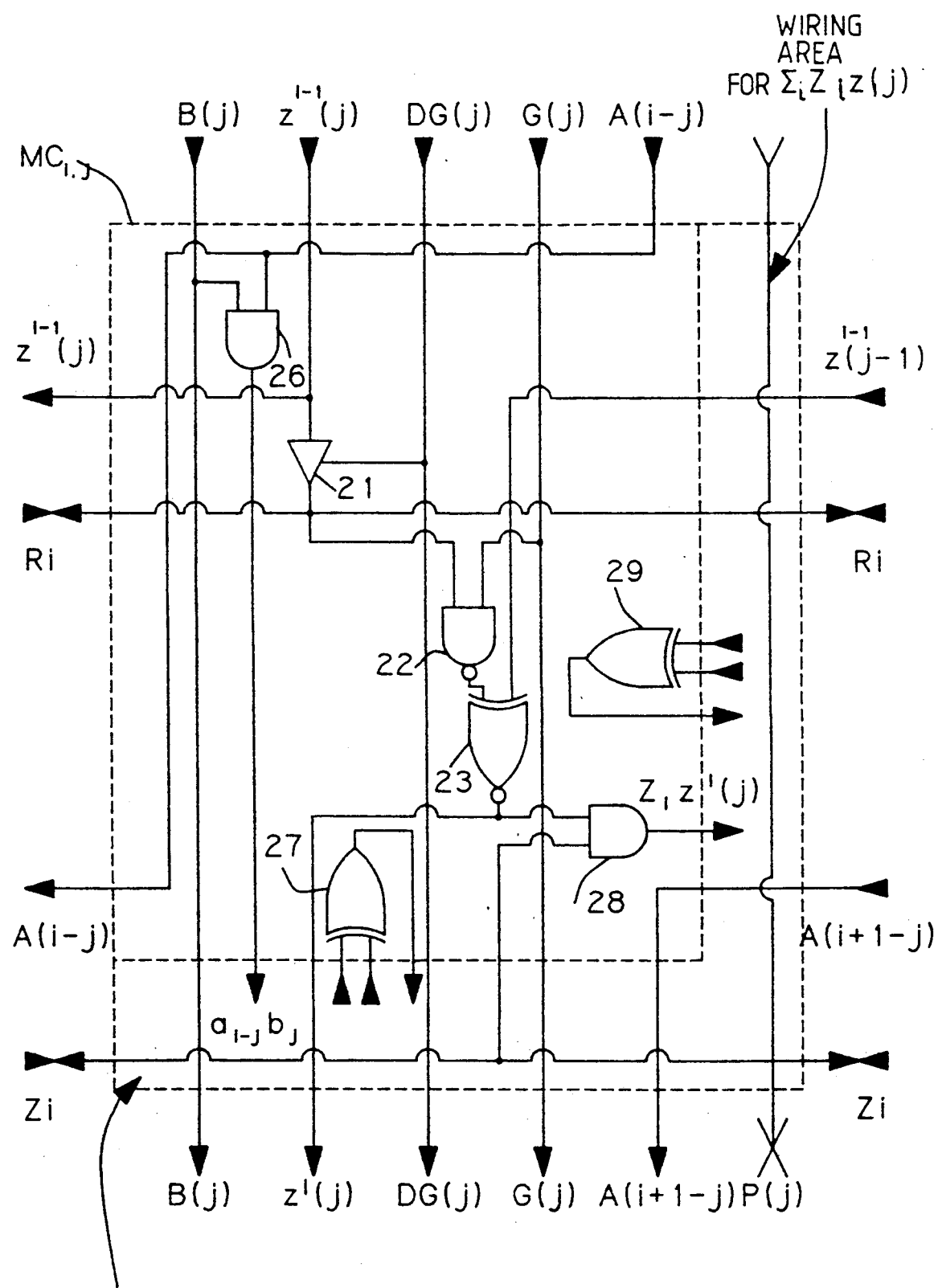
Figure 7:
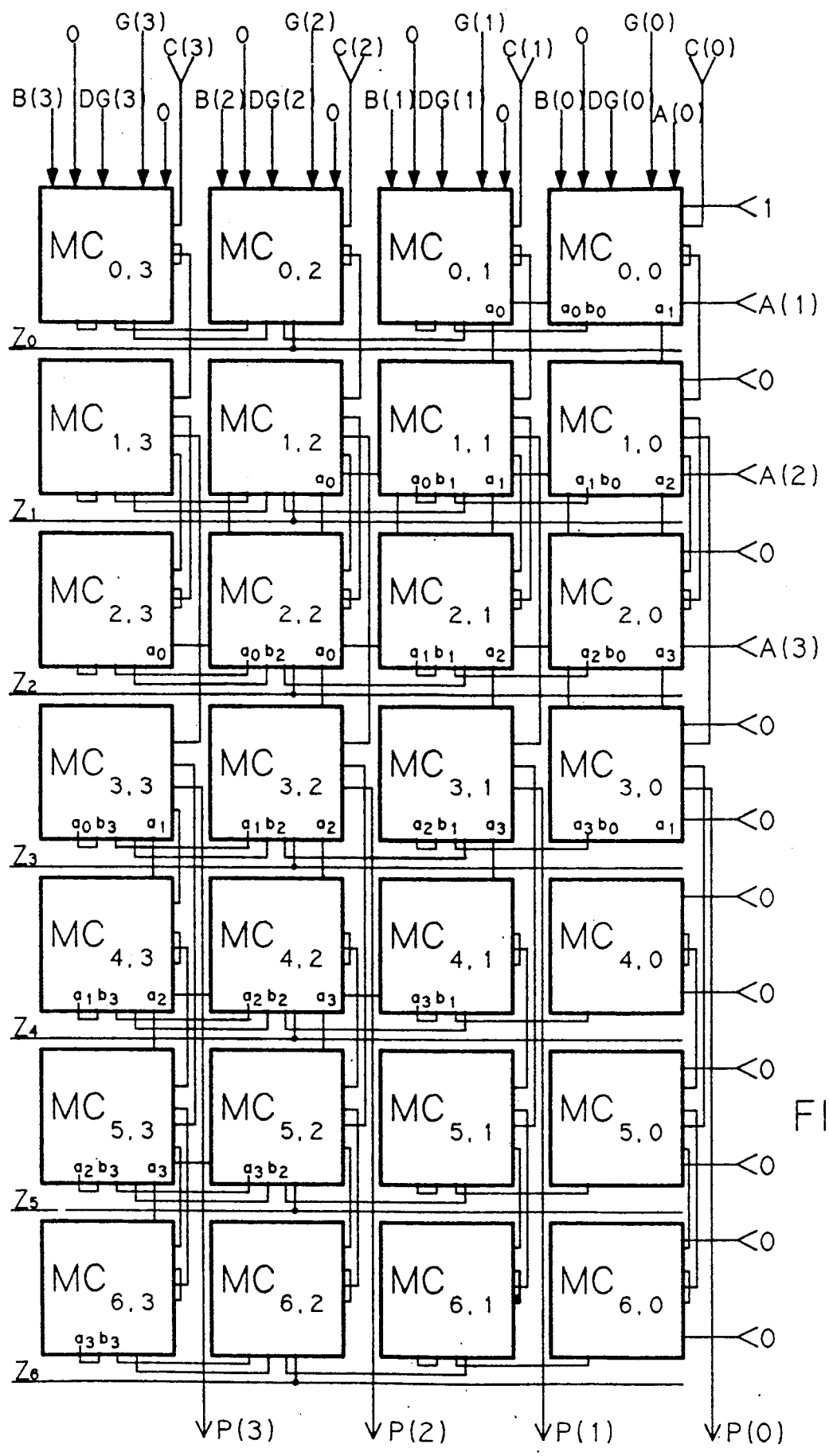

FIG. 6. is the diagram of the elementary logic cell used in the computing matrix according to the invention;

FIG. 7 is the diagram of the computing matrix according to the invention.

A Galois field is defined by its size, i.e. by the number of bits of the operands to be processed, and therefore of the results obtained, and by its generator polynomial. If A, B and C are three polynomials of a Galois field, and G is its generator polynomial: G is the generator binary polynomial of degree m of the corresponding Galois field, which fixes the size of the Galois field in which the polynomial operations are performed; A, B and C are also binary polynomial fields of degree m−1. If z is the generator element of the Galois field which is the root of the generator polynomial G of degree m: the zero element and $z^i$ from i=0 to $2^m-2$ are the $2^m$ elements of the Galois field $CG(2^m)$ and are the $M=2^m$ symbols of m bits used for the transmission. Any operation in this field necessarily generates an element of the field, and these operations can be generally expressed as follows:

$P = (A*B)_{modulo\ G} + C$ where * is the multiplication in the Galois field using elementary logic AND operations and where + is the addition in the Galois field (the logic exclusive OR operation).

By simple breakdown, as described for example in the abovementioned article, the polynomials A, B, C and G can be written as follows:

$$A = a_0 - a_1 z + a_2 z^2 + \ldots a_i z^i + \ldots a_{m-1} z^{m-1} = \sum_{i=0}^{m-1} a_i z^i$$

$$B = \sum_{i=0}^{m-1} b_i z^i; \quad C = \sum_{i=0}^{m-1} c_i z^i; \quad G = \sum_{i=0}^{m} g_i z^i = 0.$$

The highest coefficient of degree m of the polynomial G is always equal to 1: $g_m = 1$.

Consequently the result P can be expressed as follows:

$$P = \left( \sum_{i=0}^{m-1} b_i z^i A \right)_{modulo\ G} + C$$

$$= \sum_{i=0}^{m-1} b_i (A z^i)_{modulo\ G} + C$$

$$= \sum_{i=0}^{m-1} b_i A_i + C, \text{ avec } A_i = (A z^i)_{modulo\ G}$$

The developed result P is therefore:

$$P = C + b_0 A_0 + b_1 A_1 + \ldots b_i A_i + \ldots + b_{m-1} A_{m-1}$$

The computation of the product is broken down into a sum of successive partial products:

$$P_{-1} = C$$

$$P_0 = P_{-1} + b_0 A_0$$

$$P_1 = P_0 + b_1 A_1$$

$$P_i = P_{i-1} + b_i A_i \quad (1)$$

$$P_{m-1} = P_{m-2} + b_{m-1} A_{m-1} = P.$$

The computation of the $A_i$ terms is carried out according to the following sequence:

$$A_0 = A$$

$$A_1 = (Az)_{modulo\ G}$$

$$A_2 = (Az^2)_{modulo\ G} = (A_1 z)_{modulo\ G}$$

$$A_i = (Az^i)_{modulo\ G} = (Az^{i-1} z)_{modulo\ G}$$

$$= (A_{i-1} z)_{modulo\ G}$$

If the term of highest degree is equal to 0: $A_i = A_{i-1} z$
If the term of highest degree is not zero: $A_i = A_{i-1} z + G$.

These two expressions can be written simultaneously in the following form:

$$A_i = A_{i-1} z + (G\ AND\ A_{i-1}(m-1)) \quad (2)$$

where $A_i(m-1)$ is the coefficient of the term of highest degree in the polynomial $A_{i-1}$.

Figure 1:
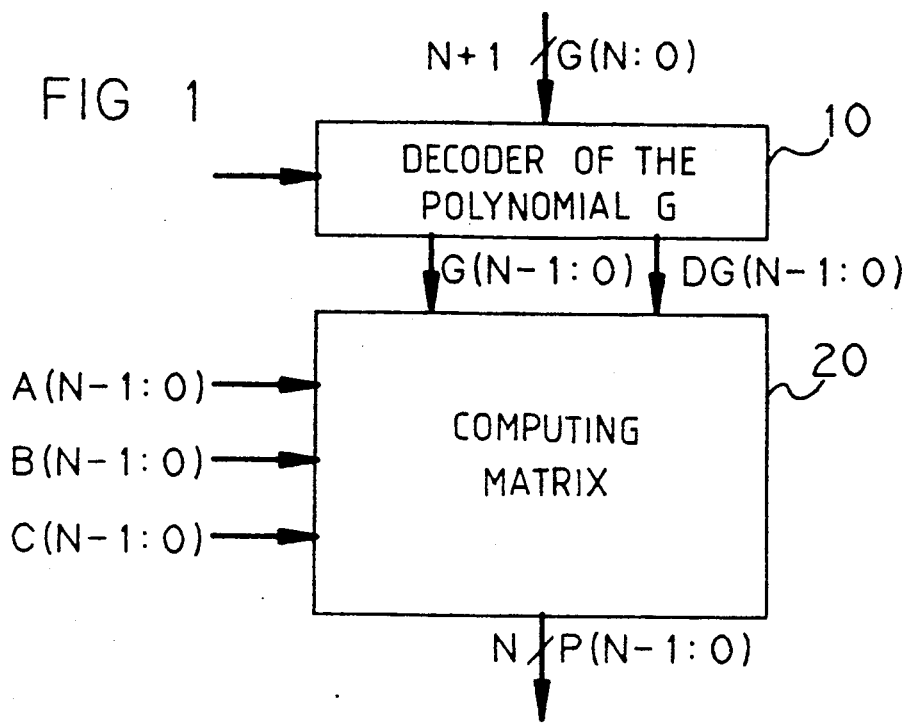
FIG. 1 is a block diagram of a type of multiplier-adder in the Galois field.

In general terms, a multiplier-adder uses the expressions described above in order to perform the operations necessary for the encoding and decoding in a Galois field $CG(2^m)$ where m is programmable up to $m = N$ by means of a matrix structure: FIG. 1 is the block diagram of such a multiplier-adder. It is subdivided into two essential parts:

a decoder 10 of the generator polynomial G which has as an input the generator polynomial G (on N+1 wires) of degree m between 0 and N, N being the maximum degree of the Galois field in which the multiplier-adder is capable of working, and as an output the same generator polynomial, but without its most significant bit which is not necessary for the computation, namely G(N−1:0) (on N wires) and also, as another output, a degree polynomial, DG, which marks the term of degree m of the generator polynomial in the Galois field used;

computing matrix 20, which has as inputs the polynomial operands A, B and C as well as the outputs of the decoder, G(N−1:0), and DG(N−1:0), and as an output the result P, its various inputs and outputs being N-wire links.

The notation G(N:0) indicates a link having N+1 wires numbered from 0 to N transmitting the various coefficients of the generator polynomial G. The notation G(i) indicates a link having 1 wire transmitting the coefficient of degree i of the generator polynomial G. This notation is used hereafter and in the figures for the various inputs and outputs of the circuits used.

Figure 2:
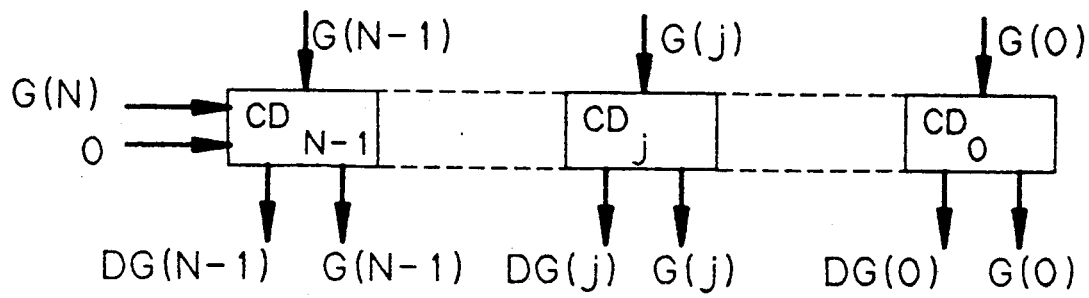
FIG. 2 is a diagram of the decoder of the generator polynomial.

The decoder 10 of the generator polynomial is shown in greater detail in FIG. 2. It is formed from N identical elementary cells $CD_0, CD_1, \ldots, CD_j, \ldots CD_{N-1}$, and its function consists, as mentioned above, in transmitting the terms of degrees m−1 to 0 of the generator polynomial G to the computing matrix and in detecting the degree of this generator polynomial.

Figure 3:
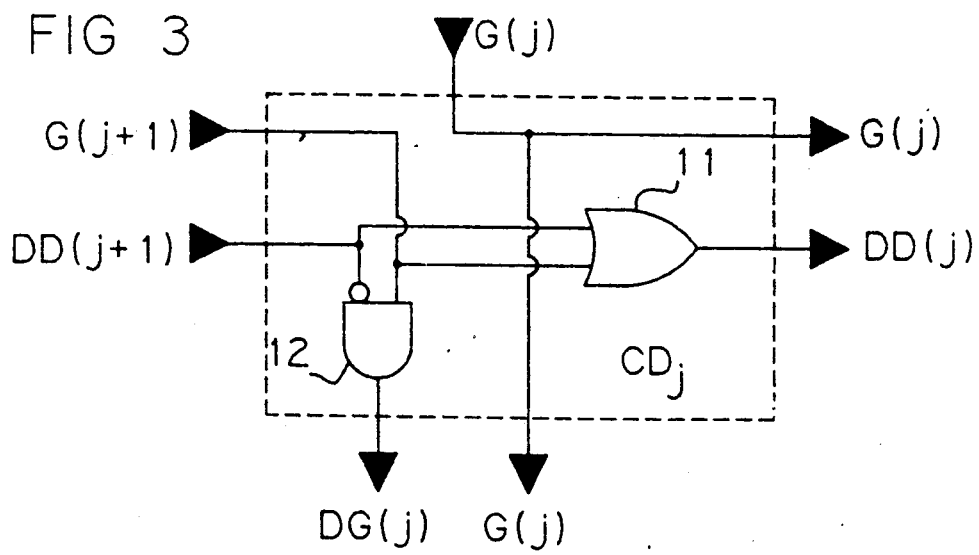
FIG. 3 is a diagram of the elementary cell of this decoder.

The cell of degree j $CD_j$ of the decoder is shown in detail in FIG. 3. This elementary cell comprises an input receiving the coefficient of degree j of the generator polynomial G(j), and two inputs connected to the outputs of the adjacent cell of degree j+1, G(j+1) and DD(j+1). From these three inputs, the cell of the decoder transmits the coefficient of degree j, G(j) on the one hand to the cell of the decoder of inferior rank $CD_{j-1}$, and on the other hand to the output, to be applied to the computing matrix 20. It forms the term DD(j) by means of an OR gate 11, whose two inputs are connected to the links DD(j+1) and G(j+1) and whose output is DD(j), and it forms the term DG(i) by means of an AND gate of which one input receives G(j+1) and of which the other, inverted input receives DD(j+ <). At the output, the bit set to 1 in DG(N−1:0) in order to indicate the degree is the bit of rank m in G taken from the cell of rank m of the decoder of the generator polynomial. The polynomial DG(N−1:0) has only its coefficient of rank m−1 equal to 1 and G(N−1:0) is similar to G(N:0) without its coefficient of rank N:

| | N | N−1 | ... | m | ... | m−1 | m−2 | ... 0 |
|---|---|---|---|---|---|---|---|---|
| G(N:0) | 0 | 0 | | 0 | 1 | X | X | ...X |
| G(N−1:0) | | 0 | ...0 | 1 | | X | X | ...X |
| DG(N−1:0) | | 0 | ...0 | 0 | | 1 | 0 | ...0 |

X represents 0 or 1 depending on the Galois field in which the computations are performed. By way of example for $CG(2^4)$, i.e. m=4, G=(10011) which is also written in polynomial form as $G(X) = X^4 + X + 1$ and DG = (01000).

In an embodiment known from the abovementioned article, the computing matrix 20 is formed from an assembly of identical elementary cells in N lines of N cells, forming N columns, the matrixing automatically providing the interconnection of the cells.

Figure 4:
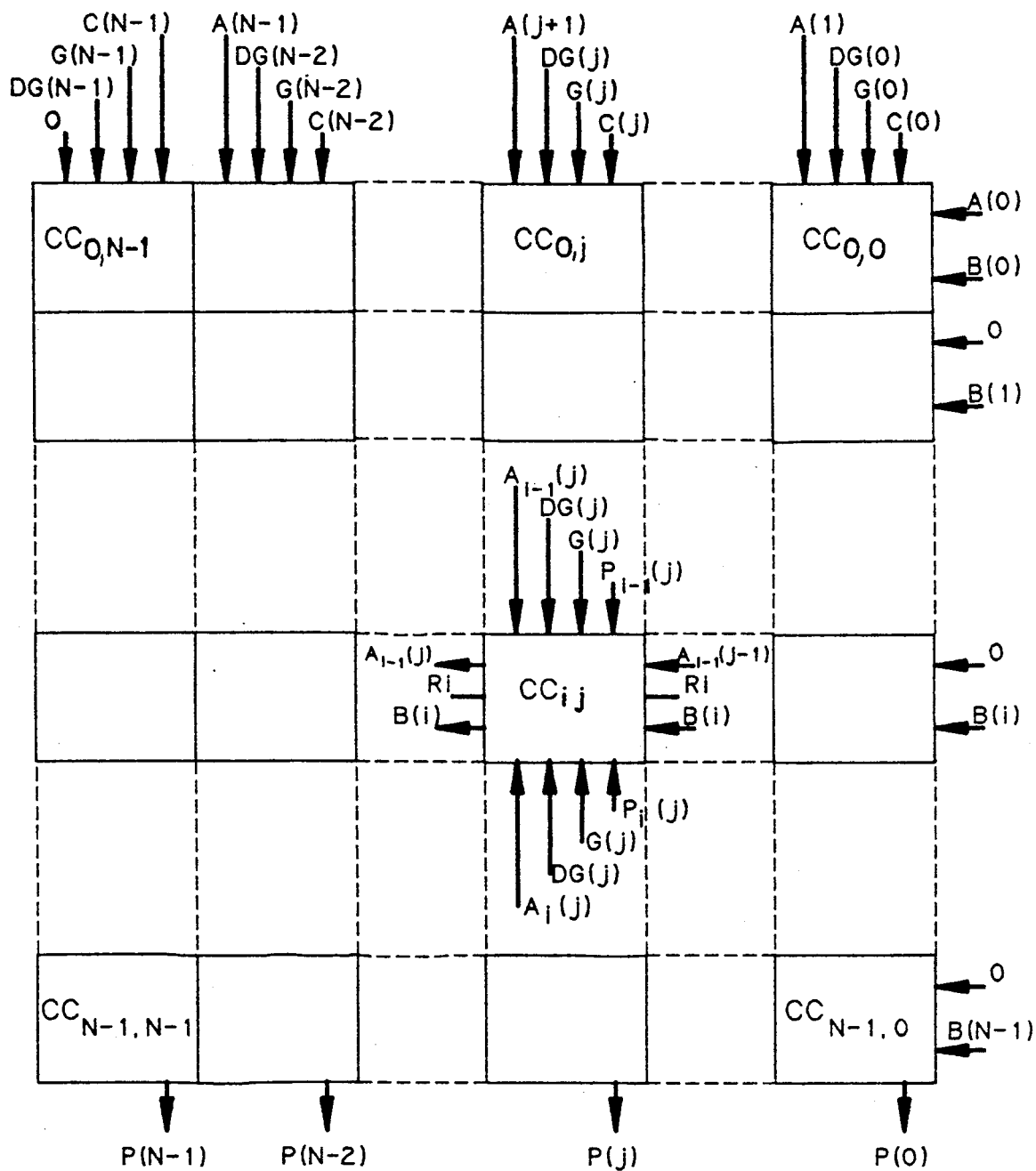
FIG. 4 is the diagram of an embodiment of the computing matrix according to the prior art.

The diagram of such a computing matrix is shown in FIG. 4, where the cells $CC_{i,j}$ are indexed by the ranks of the lines and the columns to which they belong. A horizontal line processes a word, i.e. a polynomial. It receives from the preceding line of rank $i-1$ the intermediate result $A_{i-1}$ and $P_{i-1}$ defined above, as well as the generator polynomial DG(N−1:0) and the degree of the generator polynomial DG(N−1:0) and supplies to the following line $A_1$, $P_i$, G and DG. The bits $b_i$ of the polynomial B are each distributed over a horizontal line B(i).

Each cell on a line i processes 1 bit. The cell $CC_{i,j}$ located on the line of rank i and in the column of rank j receives from the adjacent cell of the preceding line $i-1$, the bits of rank j of the polynomial $A_{i-1}$, of the polynomial DG, of the polynomial G and of the polynomial $P_{i-1}$, i.e. $A_{i-1}(j)$, DG(j), G(j) and $P_{i-1}(j)$. It also receives from the adjacent cell in the column $j-1$ the term $A_{i-1}(j-1)$ and transmits $A_{i-1}(j)$ to the adjacent cell of the column $j+1$. Finally, a horizontal link transmits the terms of rank i of B, B(i) to all of the cells of the line and another line $R_i$ supplies an information described hereafter to all of the cells of this same line.

Figure 5:
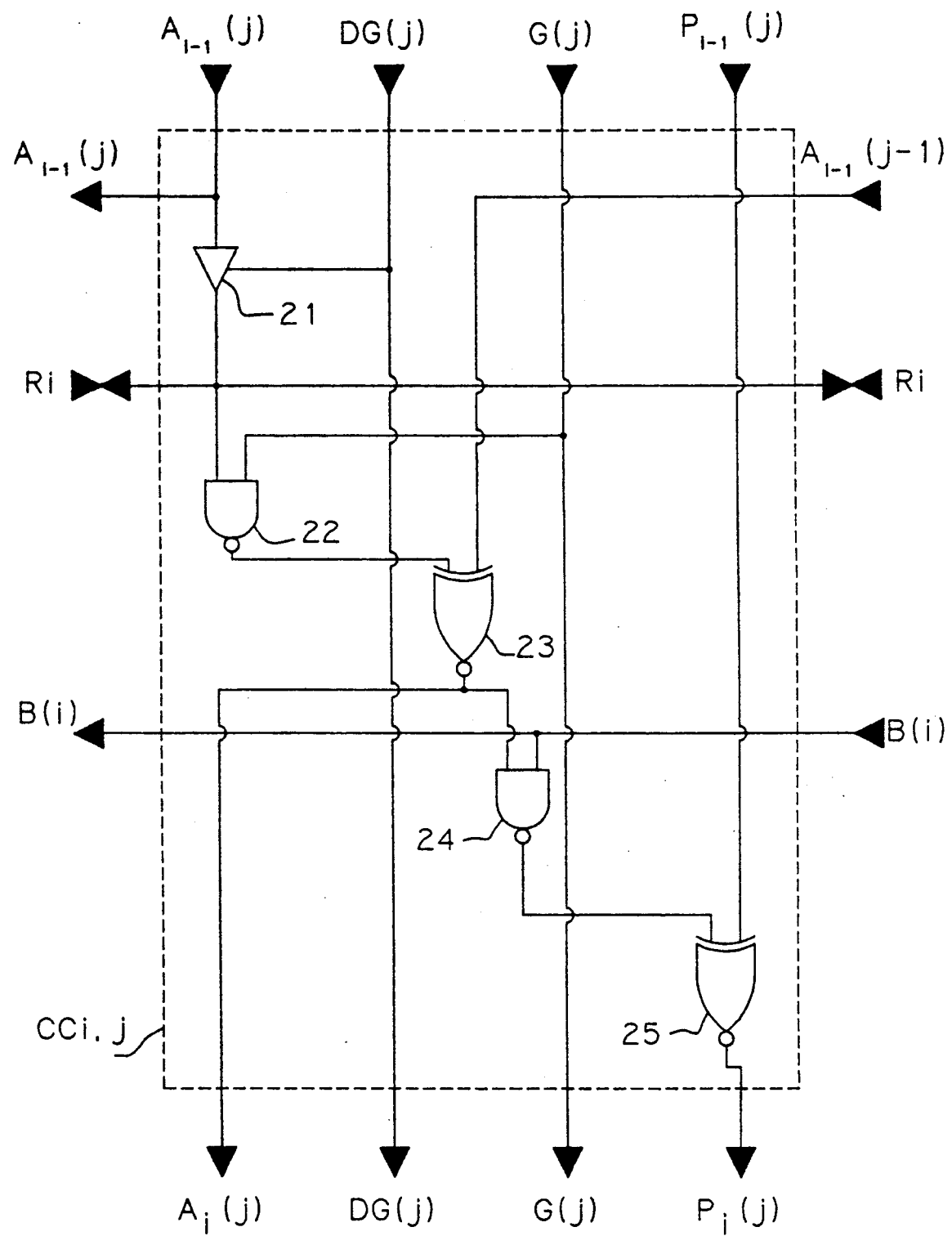
FIG. 5 is the diagram of the corresponding elementary logic cell.

The elementary cell of such an embodiment of the computing matrix is shown in FIG. 5. The various bits thus applied to a cell are combined logically by means of 5 elementary gates as follows:

a three-state gate 21 receives $A_{i-1}(j)$ and its validation input receives DG(j). This gate places the bit $A_{i-1}(j)$ on its output only for the column $j=m-1$ where DG(j)=1, i.e. $A_{i-1}(m-1)$; the output of the three-state gate is connected to the link $R_i$ between the cells of the line i.

a NAND gate 22 and an inverted exclusive OR gate 23 generate the result $$A_i(j) = A_{i-1}(j-1) + G(j)A_{i-1}(m-1),$$

which, for a complete line, corresponds to the equation (2) mentioned above: for this purpose the inputs of the gate 22 are connected to the lines G(J) and $R_i$, and its output is connected to an input of the gate 23 whose other input receives $A_{i-1}(j-1)$; the output of the gate 23 supplies $A_i(j)$.

a NAND gate 24 and an inverted exclusive OR gate 25 generate the result $$P_i(j) = P_{i-1}(j) + B(i)A_i(j),$$

which, for a complete line, corresponds to the equation (1) mentioned above: for this purpose the gate 24 receives B(i) and $A_i(j)$ on its two inputs and its output is connected to an input of the gate 25 whose other input receives $P_{i-1}(j)$.

The bits G(j) and DG(j) are transmitted to the following adjacent cell in the same column.

As mentioned above, $P_{-1}=C$, i.e. the inputs $P_{i-1}$ of the cells of the first line (rank 0) receive the terms C(j) of the polynomial C as shown in FIG. 4. Finally the outputs P(N−1:0) of the cells of the Nth line are the result outputs.

In order that the result of the computation obtained at the last line of the matrix may be significant, it is necessary that all of the operands A, B, C have degrees which are strictly lower than that of the generator polynomial G.

The essential characteristic of such a type of multiplier-adder, such as results from the above description of the first embodiment, is that after decoding of the generator polynomial G, of degree at most equal to N, and the use of a matrix of identical elementary cells, it is possible to perform computations in all of the Galois fields up to $CG(2^N)$. This embodiment uses a matrix of elementary cells, of dimensions N×N, the logic diagram of the cell comprising a 3-state gate, two NAND gates and two exclusive OR gates, and interconnections between cells such as defined above.

But, in this embodiment of known type, the generator polynomial is used in each step in the computation of the Ai terms; which results in long computation times.

The subject of the invention is a multiplier-adder to which parameters can be applied in the Galois fields in which the processing speed is privileged, this operator is described hereafter with reference to FIGS. 6 and 7 on the basis of a different analysis:

The product $P = (A*B)_{modulo\ G} + C$ can be written as follows:

$$P = \left( \sum_{i=0}^{2(m-1)} \left( \sum_{j=0}^{i} b_j a_{i-j} \right) z^i \right)_{modulo\ G} + C$$

$$P = \sum_{i=0}^{2(m-1)} z_i(z^i)_{modulo\ G} + C$$

where
$Z_0 = a_0 b_0$
$Z_1 = a_0 b_1 + a_1 b_0$
$Z_2 = a_0 b_2 + a_1 b_1 + 2_a b_0$ $$Z_i \sum_{j=0}^{i} b_j a_{i-j}$$

$Z_{m-1} = a_{m-1} b_{m-1}$

The computation of the $z^i$ terms is performed as follows:

$z^0 = 1$ $(Z^i)_{modulo\ G} = z.z^{i-1}$ if the most significant term is zero $(Z^i)_{modulo\ G} = z.z^{i-1} + G$ if the most significant term is not zero.

The computation of the $Z_i$ terms is performed directly by means of a matrix of elementary cells in which the cells useful for the computation are organized and connected in a tree structure so that with each line i an intermediate result Zi is available, areas of wiring between lines and between columns being provided in the matrix as described hereafter.

The logic diagram of the elementary cell $MC_{i,j}$ used is shown in FIG. 6, the computing matrix using a matrix of N columns and 2N−1 lines of cells such as shown in FIG. 6.

The elementary cell $MC_{i,j}$ of the column j (j between 0 and N−1) and of the line i (i between 0 and 2N−2) has 5 vertical inputs for B(j), $z^{i-1}(j)$, DG(j), G(j) and A(i−j) respectively. The input $z^{i-1}(j)$ is used for the adjacent cell $MC_{i,j+1}$ of the column $j+1$ by means of a horizontal output, while the cell receives $z^{i-1}(j-1)$ from the adjacent cell $MC_{i,j-1}$ of the column $j-1$.

As in the elementary computing cell described previously, a three-state gate 21 receives $z^{i-1}(j)$, like $A_{i-j}(j)$ in the previous case and is activated by DG(j). The only activated gate is that corresponding to the highest degree of the generator polynomial m−1, which transfers $z^{i-1}(m-1)$ on the horizontal link $R_i$ passing through all of the cells of the line i. This output is connected to the input of the NAND gate 22 whose other input receives G(j) and whose output is connected to a first input of the inverted exclusive OR gate 23 having its other input receiving $z^{i-1}(j-1)$ from the cell of previous rank in the same line, and which delivers on a vertical output $z^i(j)$.

Furthermore, each cell comprises an AND gate 26 connected to the vertical inputs A(i−j) and B(j) for the computation of a term A(i−j) B(j) and an exclusive OR gate 27 whose inputs and the output are taken vertically into a first inter-cell wiring area which is horizontal and located at the bottom of the cell for the computation of the partial products $$Z_i = \sum_{j=0}^{i} A(i-j)B(j)$$

from the intermediate results ... A(i−j) B(j) ...

Furthermore, each cell comprises in the same way a second AND gate 28 of which one input is connected to the output of the inverted exclusive OR gate 23 which supplies $z^i(j)$, and whose other input is connected to the inter-cell link $z_i$ of a same line in the horizontal wiring area, the output of this AND gate 28 being taken to a vertical wiring area in which $$P(j) = \sum_i Z_i z^i(j)$$

can be computed for a column. For this purpose each cell furthermore comprises an exclusive OR gate 29 which takes its inputs from the vertical wiring area and whose output is returned to this same wiring area.

Finally, two "oblique" links are provided in the cell, one from the vertical input A(i−j) transmits this bit A(i−j) by means of a horizontal output connection to the cell of rank j+1 of the same line i, and the other transmits this bit from the A(i+1−j) input coming from the previous cell of the same line on a horizontal input to a vertical output A(i+1−j) of the cell $MC_{i,j}$ to be taken to the next cell in the same column $MC_{i+1,j}$; these links enable the constitution of the tree structure which is useful in the interconnection of the elementary cells thus described as shown in FIG. 7.

This FIG. 7 shows the corresponding computing matrix for an embodiment in which N=4. This matrix therefore comprises N=4 columns (i.e. j=0 to 4) and 2N−1=7 (i.e. i=0 to 6) lines of elementary cells with horizontal and vertical interconnection areas between the cells of a same line or a same column. For purposes of simplification, the links between cells have not all been shown: the only links shown are the oblique links which reveal the tree structure of the matrix for the computation of the products $a_{i-j}b_j$, and the links between cells produced in the horizontal and vertical wiring areas reserved for this purpose for the computation: of the partial products $$Z_i = \sum_j a_{i-j}b_j$$

and of the terms $$P(j) = \sum_i Z_i z^i(j)$$

of the result product P(N−1:0).

The notations of the type $a_{i-j}b_j$ use the coefficients of the polynomials such as initially defined and the notations of the type A(i−j)B(j) correspond to the operations performed with the coefficients present on the inputs of the matrices such as defined above. These notations are approximately equivalent if, when working in a Galois field of lower degree than the maximum possible degree, only certain inputs of the type A(i), B(j), C(j) receive zero coefficients.

From what has been written above it results that certain elementary cells are not useful in the computation of the $a_{i-j}b_j$ terms. This is the case of the elementary cells $M_{i,j}$ for i less than j and i greater than or equal to j+4. In order to make the matrix strictly repetitive, which facilitates the corresponding manufacturing methods, these cells have not been eliminated, the useless elementary gates being made inoperative by the wiring of their inputs to an inactive level.

Thus, as revealed by the above description, parameters can be applied to the multiplier-adder by the generator polynomial whose value encodes the order m of the Galois field in which the polynomial operations are performed, m being at most equal to N.

The operator therefore uses a computing matrix whose size is a function of the parameter N; this matrix uses a single basic cell for the computations and receives data characterizing the Galois fields in which the operations are performed by a 1×N matrix which is itself formed from a single type of cell.

What is claimed is:

1. A multiplier-adder in one of
    the Galois fields up to $CG(2^N)$ where N is a predetermined integer, having three multiple inputs intended to receive the coefficients of polynomial operands A, B and C of degree m−1 less than N for the polynomial operation P in the Galois field of degree m, $CG(2^m): P = (A*B) + C$, where * and + are respectively multiplication and addition, performed Modulo G, in the Galois field $CG(2^m)$ of generator polynomial G, and a data input for applying parameters, for this generator polynomial, comprising:
    a decoder (10) constituted from a line of N elementary identical cells $CD_j$, arranged in order from j=0 to N−1, receiving the coefficients of the generator polynomial G(N:O) and transmitting the coefficients of this polynomial without the one having the highest degree G(N−1:0) and a polynomial with a significant coefficient derived by the logical combination of the generator polynomial marking the degree m of the chosen Galois field, DG(N−1:0);
    a computing matrix (20) constituted from p lines of identical elementary computing cells for performing the polynomial computation of p steps, the cells of the last line supplying the terms of degrees 0 to m−1 of the resulting polynomial P, characterized in that, for a computation in p=2N−1 steps, the computing matrix comprises 2N−1 lines from i =0 to 2(N−1) and N columns of j=0 to N−1 of cells $CM_{i,j}$ connected in a tree structure, the non-connected inputs receiving logic "0" levels, each elementary computing cells $MC_{i,j}$ comprising:

five vertical inputs connected to the vertical outputs of the preceding cell of the same column, receiving the terms of degree j, G(j), DG(j) and B(j) of the generator polynomial, of the degree polynomial, and of the polynomial B, the term of degree i−j of the polynomial A, where i is the index of the matrix line and i=0 to 2(N−1), and the term of degree j of an intermediate result $z^{i-1}(j)$ where i is the index of matrix column and j=0 to N−1, two lateral inputs receiving from the cell of the column of inferior rank of the same line the term of degree j−1 of the intermediate result $z^{i-1}(j-1)$ and the term of degree (i+1−j), A(i+1−j) of the polynomial A, two lateral outputs to be applied to the cell of superior rank of the same line supplying the term of degree j of the intermediate result $z^{i-1}(j)$ and the term of degree i−j, A(i−j) of the polynomial A.

2. A multiplier-adder according to claim 1, characterized in that each elementary cell $CD_j$ of the decoder (10) has a vertical input for the term of degree j of the generator polynomial G, G(j), two lateral inputs, coming from the cell of superior rank $CD_{j+1}$, respectively receiving the term of degree j+1 of G, G(j+1) and a bit called the degree detection bit DD(j+1), and connected on the one hand to the direct and inverted inputs respectively of a logic AND gate 12 supplying the term of degree j of the polynomial marking the degree of the generator polynomial, DG(j), on a vertical output, and on the other hand to the inputs of a logic OR gate (11) supplying the degree detection bit to the next cell, DD(j), on a first lateral output, the term of degree j of G, G(j) being transmitted by this cell to a vertical output and to a second lateral output, to be applied to the cell of inferior rank, the cell of highest rank $CD_{N-1}$ receiving G(N), and 0 on its lateral input DD(j +1).

3. A multiplier-adder according to claim 2, characterized in that the logic computing circuit of each elementary computing cell $CM_{i,j}$ comprises:

a three-state gate 21 connected to the input $z^{i-1}(j)$ and controlled by DG(j) whose output is connected to a connecting line between cells $R_i$ of a same line in order to transmit $Z^{i-1}(m-1)$ to all of the cells of the line i, logic combination means comprising an AND gate (26) to compute A(i−j) B(j), a NAND gate (22) and an inverted exclusive OR gate (23) for computing $z^i(j)=z^{i-1}(j-1)+G(j)z^{i-1}(m-1)$, an AND gate (28) of which one input receives $z^i(j)$ and the other $$Z_j = \sum_i A(i-j)B(j)$$

taken from a line wiring area extending between two consecutive lines, each cell furthermore comprising, for the computation of $Z_i$, an exclusive OR gate (27) having its inputs and its output in the line wiring area, and a column wiring area extending between two consecutive columns, in which is connected the output of the AND gate supplying $Z_i z^i(j)$, each cell furthermore comprising an exclusive OR gate (29) having its inputs and its output in the inter-column wiring area for the computation of $$P(j) = \sum_i Z_i z^i(j) + C(j).$$

and in that the term A(0) is applied to the input A(i−j) of the cell $MC_{0,0}$, the terms A(i), for i=1 to m−1, being respectively applied to the inputs A(i+1−j) of the cells $MC_{i,0}$ for i=0 to m−2.

4. Use of a multiplier-adder in the Galois fields according to one of claims 1 to 3 in a digital signal processing processor for the encoding and decoding of information using error detecting and correcting codes with values in the Galois fields.

* * * * *